United States Patent
Mazumder et al.

(10) Patent No.: US 12,073,913 B2
(45) Date of Patent: Aug. 27, 2024

(54) SYNCHRONOUS INPUT BUFFER CONTROL USING A STATE MACHINE

(71) Applicant: Micron Technology, Inc., Boise, ID (US)

(72) Inventors: Kallol Mazumder, Dallas, TX (US); Navya Sri Sreeram, Plano, TX (US)

(73) Assignee: Micron Technology, Inc., Boise, ID (US)

(*) Notice: Subject to any disclaimer, the term of this patent is extended or adjusted under 35 U.S.C. 154(b) by 164 days.

(21) Appl. No.: 17/821,740

(22) Filed: Aug. 23, 2022

(65) Prior Publication Data

US 2024/0071436 A1 Feb. 29, 2024

(51) Int. Cl.
*G11C 7/10* (2006.01)

(52) U.S. Cl.
CPC .......... *G11C 7/1084* (2013.01); *G11C 7/1069* (2013.01); *G11C 7/1093* (2013.01); *G11C 7/1096* (2013.01)

(58) Field of Classification Search
CPC ... G11C 7/1084; G11C 7/1069; G11C 7/1093; G11C 7/1096; G11C 7/1066; G11C 7/222
See application file for complete search history.

(56) References Cited

U.S. PATENT DOCUMENTS

| | | | |
|---|---|---|---|
| 10,176,862 B1* | 1/2019 | Penney | G06F 11/1004 |
| 2005/0152209 A1* | 7/2005 | Shin | G11C 7/1072 |
| | | | 365/233.1 |

* cited by examiner

*Primary Examiner* — Xiaochun L Chen
(74) *Attorney, Agent, or Firm* — Fletcher Yoder, P.C.

(57) ABSTRACT

A memory device includes a command interface configured to receive write commands from a host device. The memory device also includes an input buffer configured to buffer data from the host device. Additionally, the memory device includes a state machine configured to receive a command into a first partition of the state machine and to enable a data strobe (DQS) input buffer in response to the indication. The state machine is also configured to maintain the enablement of the DQS input buffer while the command traverses the state machine. Furthermore, the state machine is configured to disable the DQS input buffer after a set duration of time.

26 Claims, 7 Drawing Sheets

SYNCHRONOUS INPUT BUFFER CONTROL USING A STATE MACHINE

BACKGROUND

Field of the Present Disclosure

Embodiments of the present disclosure relate generally to memory devices. More specifically, embodiments of the present disclosure relate to enabling and disabling an input buffer of a memory device.

Description of Related Art

Generally, a computing system may include electronic devices that, in operation, communicate information via electrical signals. For example, a computing system may include a processor communicatively coupled to a memory device, such as a dynamic random-access memory (DRAM) device, a ferroelectric random-access memory (FeRAM) device, another random-access memory (RAM) device, and/or a hybrid device that incorporates more than one type of RAM. In this manner, the processor may communicate with the memory device, for example, to retrieve executable instructions, retrieve data to be processed, by the processor, and/or store data output from the processor.

The host device (e.g., processor) may send data and commands to the memory devices. The memory devices utilize input buffers to capture input data received from the host device. These input buffers may be selectively disabled and enabled using input buffer enable signals. For instance, a data strobe (DQS) input buffer is used to buffer the DQS received from the host device that is used to assist in capturing data received from the host device. The DQS may also be divided into 4 phases using a DQS clock generator. A data (DQ) input buffer may be used to buffer data from the host device. At the conclusion of a write command, the data input buffer may be disabled to save power when there is a relatively large separation (e.g., minimum separation of 25 tCKs) between write commands. During this input buffer disable period, the DQS clock generator will reset to synchronize the state of the DQS clocks for the next incoming write. It is possible that at certain write-to-write timings, this input buffer disable period may be too short to properly reset the DQS clock generator in all operating conditions and may result in a partial reset condition. This partial reset of the DQS clock generator may be related to asynchronous behavior of the input buffer enable circuitry that causes a failure (e.g., a sliver fail) in the memory device with the data input buffer dropping the first data bits of the second write command after the truncated input buffer disable.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously discussed, truncated input buffer disable periods may cause memory failures where a portion of input bits are dropped due to a partial reset of a four-phase DQS clock generator. To address this failure, input buffer control may implement a synchronous solution for enabling and disabling the data and DQS input buffers to ensure that the data input buffer enable behavior is deterministic and to ensure that the data and DQS input buffers have sufficient reset pulse durations. For instance, the memory device may utilize an already existing read-modify-write (RMW) state machine in the memory device. A write command generates a read command pulse followed by a write command pulse with ECC occurring between the read and write command pulses. The progress of a write command pulse through the RMW state machine is used to generate a synchronous DQS input buffer enable envelope. Furthermore, this generation of the synchronous DQS input buffer enable envelope is performed using a CWL-shifter clock that wakes up naturally to implement the RMW state machine with every write command enabling such synchronous and deterministic behavior without generating any additional clocks.

Figure 1:
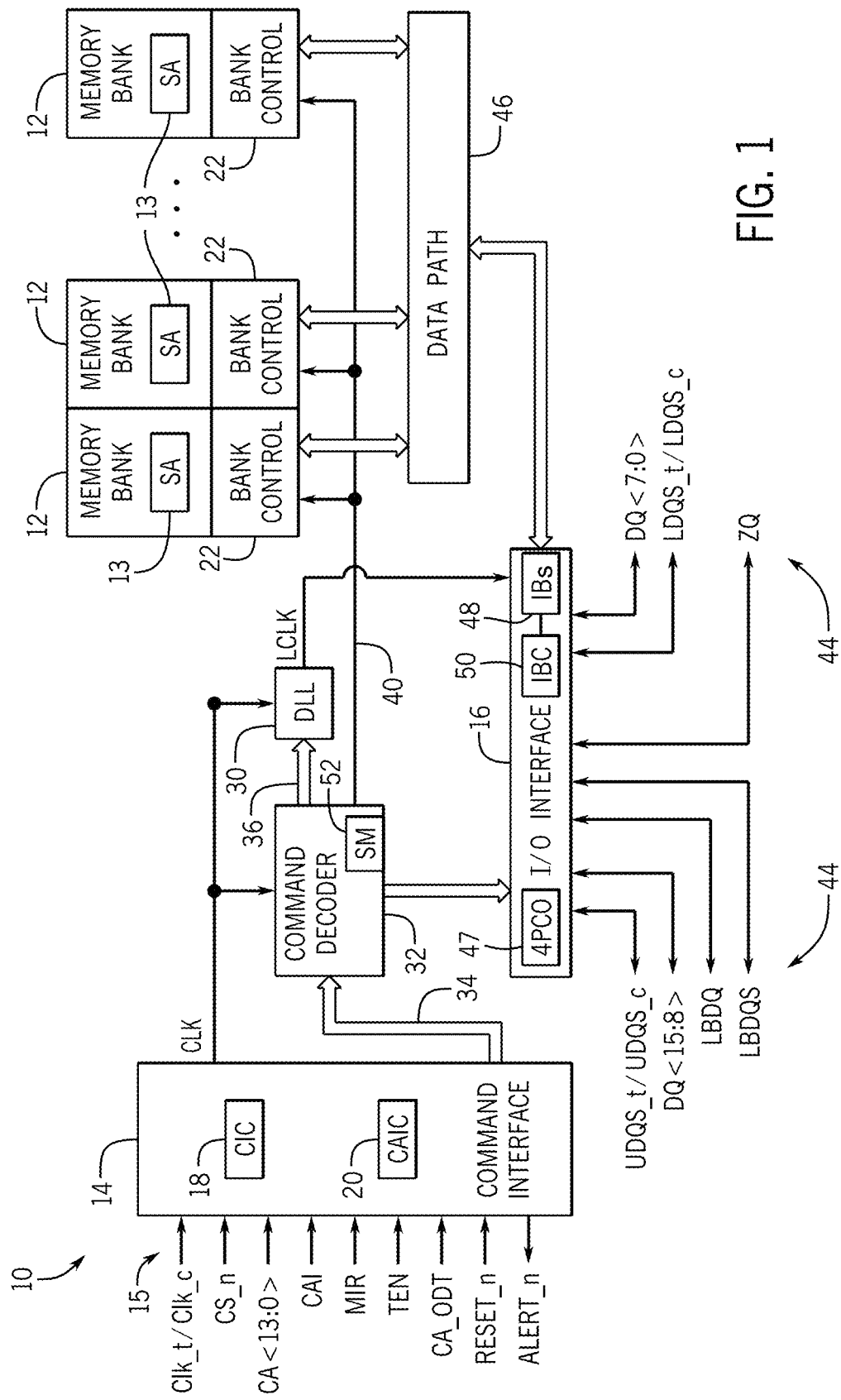
FIG. 1 is a simplified block diagram illustrating certain features of a memory device having input buffers and a state machine, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory banks 12 and/or bank control blocks 22 include sense amplifiers 13. As previously noted, sense amplifiers 13 are used by the memory device 10 during read operations. Specifically, read circuitry of the memory device 10 utilizes the sense amplifiers 13 to receive low voltage (e.g., low differential) signals from the memory cells of the memory banks 12 and amplifies the small voltage differences to enable the memory device 10 to interpret the data properly The memory device 10 may include a command interface 14 and an input/output (I/O) interface 16. The command interface 14 is configured to provide a number of signals (e.g., signals 15) from an external (e.g., host) device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, the true clock signal Clk_t and the bar clock signal Clk_c. The positive clock edge for DDR refers to the point where the rising true clock signal Clk_t crosses the falling bar clock signal Clk_c, while the negative clock edge indicates that transition of the falling true clock signal Clk_t and the rising of the bar clock signal Clk_c. Commands (e.g., read command, write command, etc.) are typically entered on the positive edges of the clock signal and data is transmitted or received on both the positive and negative clock edges.

The clock input circuit 18 receives the true clock signal Clk_t and the bar clock signal Clk_c and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. In some embodiments, the clock input circuit 18 may include circuitry that splits the clock signal into multiple (e.g., 4) phases. The clock input circuit 18 may also include phase detection circuitry to detect which phase receives a first pulse when sets of pulses occur too frequently to enable the clock input circuit 18 to reset between sets of pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes the bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20, which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

The DQS may be divided into multiple (e.g., 4 phases) using a 4-phase clock generator (4PCG) 47 that may output successive pulses of the DQS to different clocks to generate different phases. Furthermore, the DQ and DQS signals may be buffered in the memory device 10 using respective input buffers (IBs) 48. Input buffer control circuitry (IBC) 50 may enable and disable the input buffers 48. However, as previously noted, some input buffer disable periods that are shorter than a certain width (e.g., 1-4 tCKs) may cause the 4PCG 47 to be partially reset which may induce the input buffer(s) 48 (e.g., data input buffer) to fail to buffer/drop at least some data bits transmitted via the DQ signals. Thus, as discussed below, the input buffer control circuitry 50 may enforce a minimum write-to-write before disabling the input buffer and enforce a minimum pulse width of input buffer disable periods when disables occur to ensure the full or proper reset of the 4PCG 47.

The memory device 10 includes a state machine 52 that may be used to generate a read-modify-write (RMW) command sequence from an external write command. Furthermore, since DDR5 has error correction code (ECC) built into the data access path, each write command is decoded for RMW, and the state machine generates a pair of column command pulses. The first pulse initiates a read operation, and the second pulse initiates a write operation. ECC correction takes place between these two command pulses. As is discussed below, this state machine 52 for RMW may be utilized to generate a synchronous DQS-IB enable envelope to enable/disable the IBs 48. This enable is clocked using a column address strobe (cas) write latency (CWL)-shifter clock that wakes up naturally to execute the state machine 52 with every write command. Accordingly, the deterministic synchronized input buffer control may be realized without generating a special clock for that purpose. Although the state machine 52 is shown within the command decoder 32, the state machine 52 may be located in and/or distributed between any suitable locations, such as the I/O interface 16 (e.g., the IBC 50).

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback data signal (LBDQ) and loopback strobe signal (LBDQS) may be provided to the memory device 10 through the IO interface 16. The loopback data signal and the loopback strobe signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both LBDQ and LBDQS or possibly just a loopback data pin. This is generally intended to be used to monitor the data captured by the memory device 10 at the IO interface 16. LBDQ may be indicative of a target memory device, such as memory device 10, data operation and, thus, may be analyzed to monitor (e.g., debug and/or perform diagnostics on) data operation of the target memory device. Additionally, LBDQS may be indicative of a target memory device, such as memory device 10, strobe operation (e.g., clocking of data operation) and, thus, may be analyzed to monitor (e.g., debug and/or perform diagnostics on) strobe operation of the target memory device.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description. Furthermore, although the foregoing discusses the memory device 10 as being a DDR5 device, the memory device 10 may be any suitable device (e.g., a double data rate type 4 DRAM (DDR4), a ferroelectric RAM device, or a combination of different types of memory devices).

Figure 2:
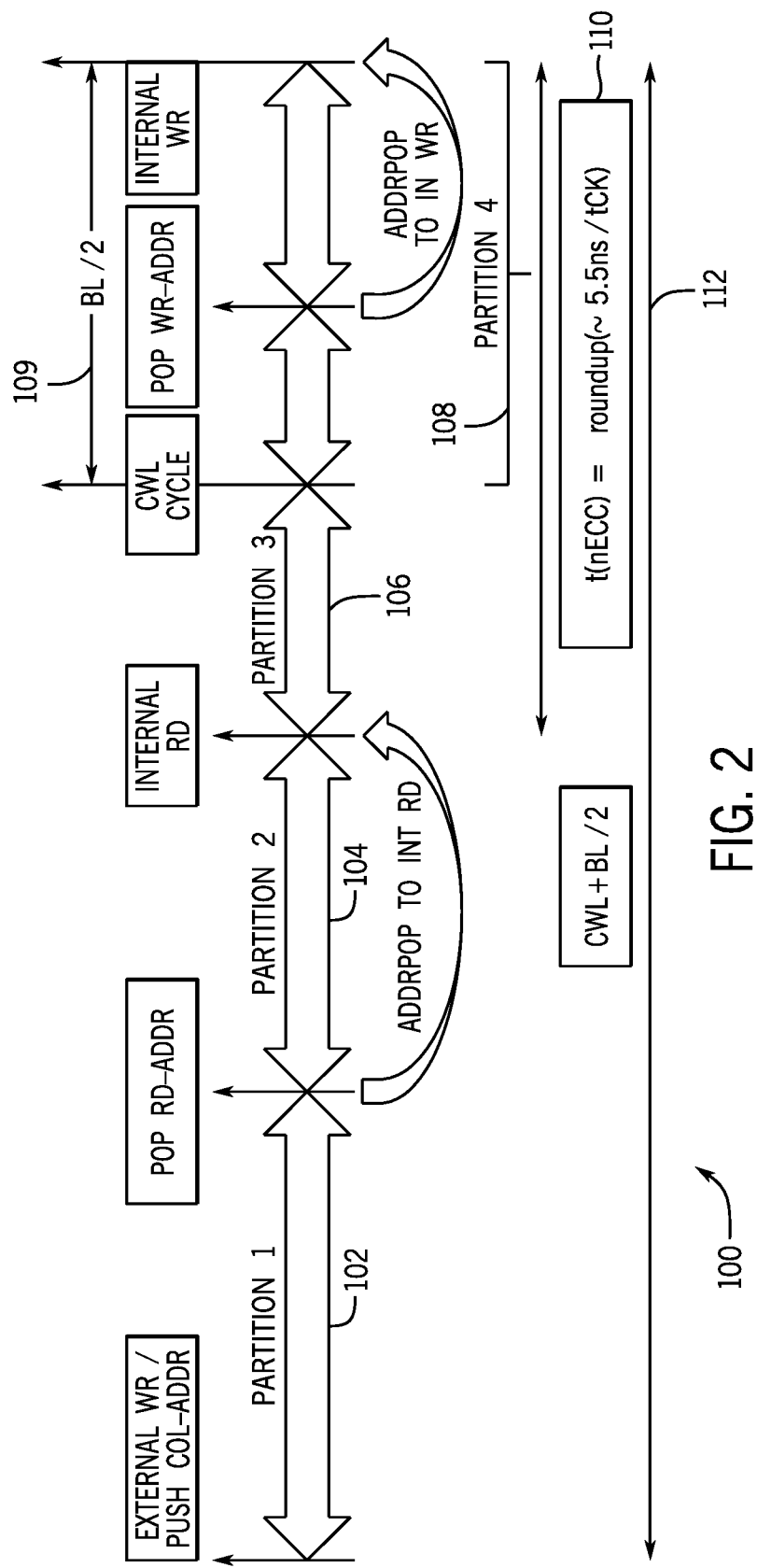
FIG. 2 is a flow diagram of an embodiment of operations performed using the state machine of FIG. 1, according to an embodiment of the present disclosure.

FIG. 2 is a flow diagram 100 implemented using the state machine 52. The state machine 52 executes the following sequence of commands: pushing a column-address into a first in first out buffer (FIFO), popping the column-address from the FIFO for an internal read operation, ensuring that there is enough time available between the internal read operation and an internal write operation to evaluate ECC, popping the column address into another FIFO for the internal write operation, and generating the internal write operation at a specific time (e.g., WCL+burstlength (BL)/2 for DDR memory devices). DQS is to be enabled (e.g., via the IBs 48) a few cycles prior to CWL to account for wake-up time/preamble durations. For example, the wake-up time may be a number (e.g., 7) of tCKs. This number may be related to the speed grade of the memory device 10 (e.g., 7200 MHz) that may be set using a mode register (e.g., MR 13). Similarly, the preamble may have a maximum number (e.g., 4) of tCKs. Plus, some additional margin (e.g., 1-26 tCKs) may be included to wake the DQS input buffer earlier.

Additionally, bits of external data are captured during the CWL+BL/2 cycles. However, when CRC is enabled, the WR CRC data is also collected adding an extra cycle. Thus, the DQS IB (of the IBs 48) remains asserted until at least CWL+BL/2+1. In some devices with divided clock topologies, the IBC 50 take one or more clock cycles. For instance, in a memory device 10 having odd and even pipelines, the DQS IB may remain asserted for CWL+BL/2+2 cycles for ease of implementation while also accommodating a longer (e.g., 1.5 tCK) postamble rather than a shorter/default (e.g., 0.5 tCK) postamble.

The state machine 52 may be a sequence of shifter stages as different "partitions" of the state machine 52. For instance, the state machine 52 includes a first partition 102, a second partition 104, a third partition 106, and a fourth partition 108, collectively referred to as partitions 102-108. The lengths of the partitions 102-108, may vary depending upon the sequence. For instance, the pop for the column address can happen a set number (e.g., 4) of tCKs before the internal read or write operations. Furthermore, the fourth partition 108 occurs during the BL/2 109 tCK (e.g., 16/2=8 tCKs). In other words, the length of the partitions 104 and 108 may be constant in tCKs, but the operating frequency changes the duration of the partitions 104 and 108 in time. ECC evaluation time 110 may be relatively constant (e.g., around 5.5 ns) regardless of speed grade. Accordingly, the duration of partitions 106 and 108 together may be constant in time, but the partition 106 may change in number of tCKs depending on the speed grade of the memory device.

As a write command progresses through the partitions 102-108, the state machine 52 generates a "burst-in-progress" flag that is sampled by a CWL-shifter clock to control DQS enabling to make the enabling/disabling of the DQS IB (of the IBs 48) synchronous. In some embodiments, the flag is set to the fourth partition 108 that sets/enables the DQS IB buffer with an enable signal (e.g., WrENIB signal). Specifically, the setting/assertion of the flag happens when the command enters the first partition 102. This set time meets a wake up time plus maximum write preamble criteria for enabling the DQS IB. The reset of this flag happens at expiry of the CWL+BL/2 112 plus two additional clock cycles. As previously discussed, this reset is delayed to ensure that the DQS IB remains enabled past the last write data bit/write postamble and any potential CRC operations. Both the set and reset are generated by the same clock Since the duration of the DQS IB enable is tied to the speed of the clock, the width in time of the DQS IB enable is determined by the speed grade setting for the memory device. An external write command to write command separation of a number (e.g., 1) cycle greater than this width will produce the minimum reset pulse giving a minimum reset pulse having a duration equal to the number of cycles.

Figure 3:
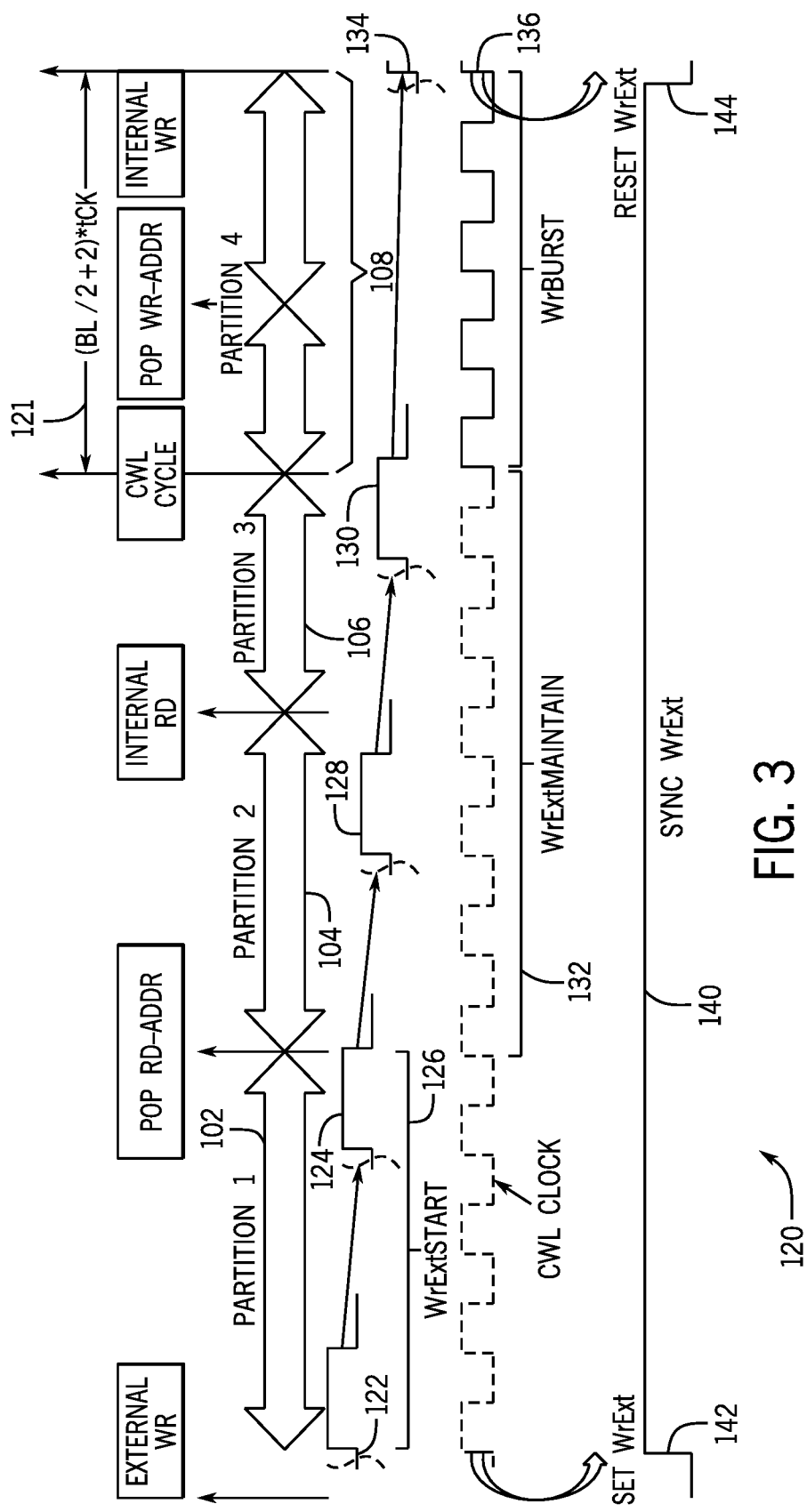
FIG. 3 is a flow diagram of an embodiment of operations performed using the state machine of FIG. 1 with an extended duration before allowing resetting of the input buffers of FIG. 1, according to an embodiment of the present disclosure.

FIG. 3 is a flow diagram 120 that includes the partitions 102-108 showing the partition 108 extending for a duration (BL/2+2) tCKs 121. The flow diagram 120 also shows pulses of commands 122 and 124 that are in the partition 102. The commands 122 and 124 (and any other commands in the partition 102) are combined (e.g., ORed) together to generate a WrExtStart signal 126 that is used to enable the DQS IB. Similarly, a command 128 in the partition 104 and a command 130 in the partition 106 (along with any other commands in the partitions 104 and 106) are combined (e.g., ORed) together to generate a WrExtMaintain signal 132 used to maintain the enablement of the DQS IB. Likewise, a command 134 in the partition 108 (along with any other commands in the partitions 108) are combined (e.g., ORed) together to generate a WrBurst signal 136 also used to maintain the enablement of the DQS IB.

The movement of the commands 122, 124, 128, 130, and 134 propagate through the partitions 102-108. These commands may be propagated using and/or sampled using a CWL-shifter clock (CWL clock) 138. The CWL clock 138 wakes up with every write command. The sampled commands are then combined (e.g., using OR gates) causing the control of the DQS IB to be synchronous with the CWL clock. The enable/disable of the DQS IB is controlled using a synchronous write extend (Sync WrExt) signal 140 that has a rising edge 142 tied to a command entering the first partition 102. After the rising edge 142, the Sync WrExt signal 140 remains asserted until a falling edge 144 when CWL+BL/2+2 tCKs have elapsed since the command entered the first partition 102. In other words, the activation and deactivation of the DQS IB is synchronous with the CWL clock 138.

Figure 4:
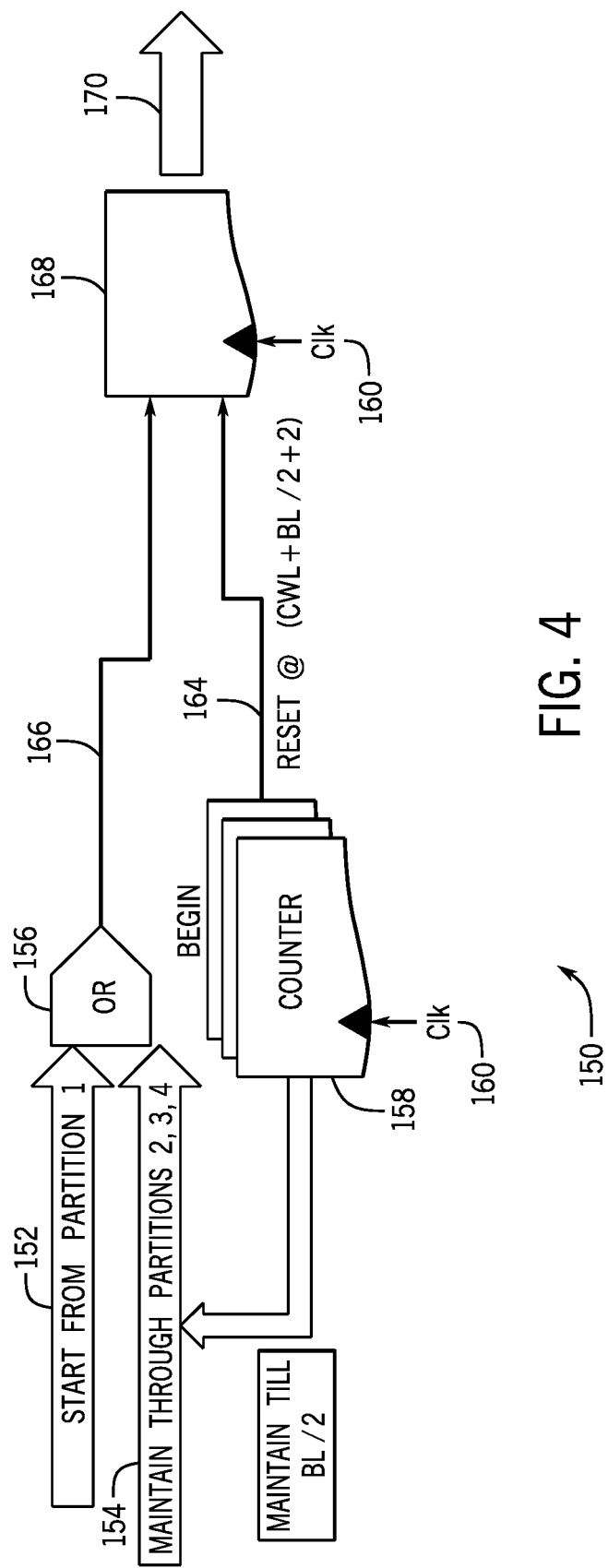
FIG. 4 is a block diagram of circuitry of the state machine of FIG. 1 to implement the flow diagram of FIG. 3 with a speed-grade dependency, according to an embodiment of the present disclosure.

FIG. 4 is a block diagram of circuitry 150 used to implement the process shown in FIGS. 2 and 3. The circuitry 150 receives a start signal 152 from the first partition 102. The start signal 152 may be the WrExtStart signal 126. The circuitry 150 also receives a maintain signal 154 from the partitions 104, 106, and/or 108. For instance, the maintain signal 154 may include the WrExtMaintain signal 132 and/or the WrBurst signals 136. For instance, the WrExtMaintain signal 132 and the WrBurst signals 136 may be combined (e.g., ORed, etc.) prior to transmission to OR circuitry 156 of the circuitry 150 or may be both transmitted to the OR circuitry 156. The OR circuitry 156 may be one or more OR gates or other circuitry (e.g., NAND, NOR, etc.) that may be suitable for performing an OR operation.

The circuitry 150 also includes one or more counters 158 that count a number of clock cycles (e.g., CWL+BL/2+2 tCKs) that start when a command enters the first partition 102. After that command, the one or more counters 158 count the number of clock cycles of a clock and may output a reset signal 164 indicative that a reset is to occur (e.g., of the Sync WrExt signal 140). The one or more counters 158 may utilize a clock 160 (e.g., the CWL clock 138) that is also used to launch an enable the DQS IB when the start signal 152 is asserted. Particularly, the DQS IB may be enabled when any of the start signal 152 or the maintain signal 154 are asserted and not reset by the one or more counters 158. As such, a flip-flop 168 may be used to sample the outcome of the OR circuitry 156 at an input 166 to the flip-flop 168.

The flip-flop 168 may be clocked using the clock 160. The reset signal 164 may be received at a reset pin of the flip-flop 168. The flip-flop 168 may latch and output a signal 170 that is high after the start signal 152 has been asserted until the reset signal 164 resets the signal 170. The signal 170 may be the Sync WrExt signal 140. Furthermore, in embodiments where the memory device 10 includes multiple (e.g., 2) pipelines, different instantiations of the circuitry 150 may be included in more than one of the pipelines.

Using the circuitry 150, the memory device 10 has a simple and intuitive implementation to utilize existing signals from the state machine 52 to enable and disable the DQS IB. Furthermore, the reset timing of the DQS IB is deterministic even if dependent upon the speed grade setting. Furthermore, the controls may be implemented using already existing counters to enable a deterministic reset timing of the DQS IB.

Although the foregoing embodiments are deterministic, the reset timing of the DQS IB is still dependent upon speed grade setting. The number of tCKs from the start of the WRENIB signal that enables the DQ IB until the end of the WRENIB signal is relative to speed grade. For instance, this duration (e.g., 38 or 39 tCKs) may be constant in tCKs while differing based on speed grade. For instance, at a first speed (e.g., 1980 MHz), the WRENIB signal may start at a first point (e.g., CWL-16) while the end of the WRENIB signal happens at a second point (e.g., CWL+22). At a second speed (e.g., 7200 MHz), the WRENIB signal may start at another point (e.g., CWL-28) and end at a different point as well (e.g., CWL+10). Although the start and end points may be different between speed grades, the number of tCKs remains constant between speed grades. However, some embodiments of the memory device 10 may be implemented to remove the speed grade dependency of the reset of the DQS IB. For instance, the endpoint where the WRENIB signal is used to disable the DQS IB may be adjustable by programming the end point to be speed dependent.

Figure 5:
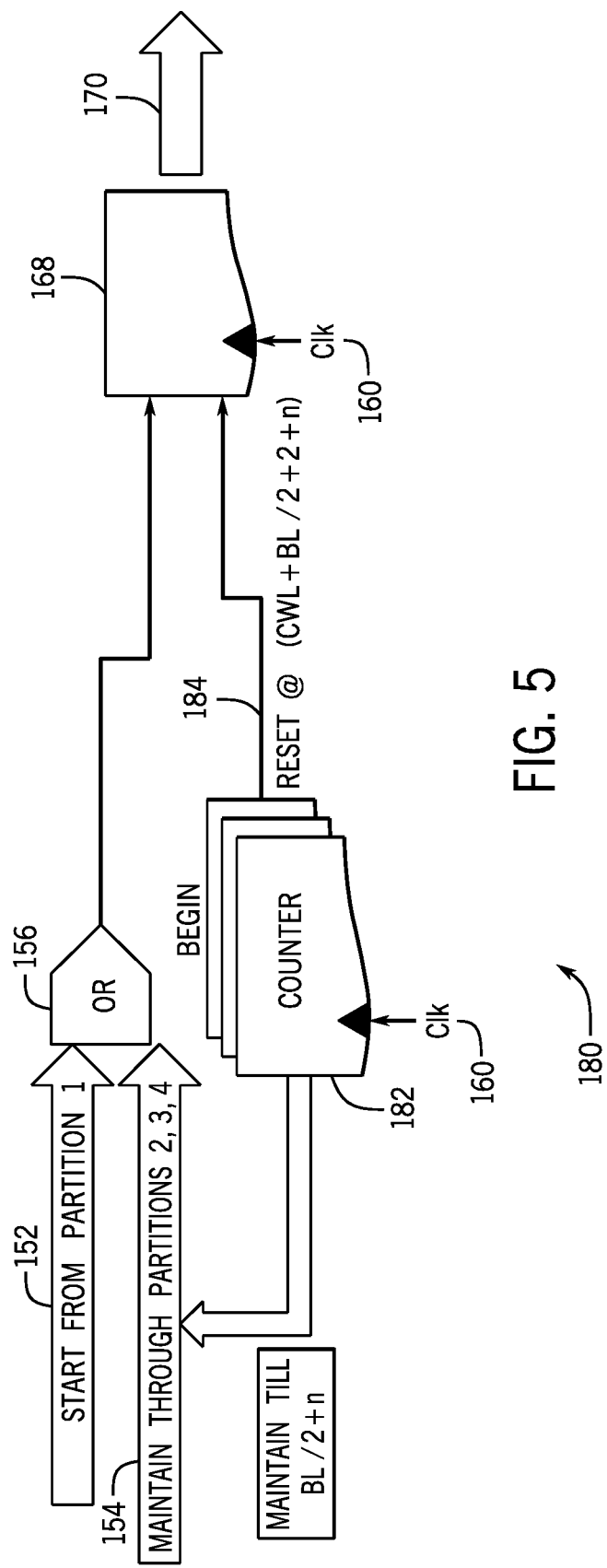
FIG. 5 is a block diagram of circuitry of the state machine of FIG. 1 to implement the flow diagram of FIG. 3 that is speed grade independent, according to an embodiment of the present disclosure.

FIG. 5 is a block diagram of circuitry 180 used to implement the process shown in FIGS. 2 and 3 but removing the speed grade dependency by adjusting the end point of when the DQS IB is disabled. In fact, the circuitry 150 is identical to the circuitry 150 except that the circuitry 180 utilizes one or more counters 182 instead of the one or more counters 158. The one or more counters 182 of the circuitry 180 differs from the one or more counters 158 in that the one or more counters 182 count an additional number (e.g., variable number n) of clock cycles before launching a reset signal 184. Thus, while the reset signal 164 launches at CWL+BL/2+2, the reset signal 184 launches at CWL+BL/2+2+n. The timing of the launching of the reset signal 184 may be consistent for different speed grades even though n changes across the speed grades. In other words, the number of cycles before a reset may change to compensate and keep the timing of the reset after a write command enters the first partition 102 regardless of speed grade. To accommodate the additional n cycles, the one or more counters 182 may include the worst-case number (e.g., 12) of additional cycles. These additional cycles may add additional power consumption and layout footprint in exchange for the removal of the speed grade dependency.

Otherwise, the circuitry 180 functions similar to the circuitry 150. The number n is speed grade dependent and may be set based on a mode register, fuse, etc. that indicates the speed grade of the memory device. The launch of the reset may be consistent between different clock speeds by adding the n as a buffer to achieve the longest duration regardless of speed. For instance, n may be a first value (e.g., 12) for a first group of speeds (e.g., 1980, 2100, 2400, 2666, 2933, 3200, 3600), a second value (e.g., 10) for a second group of speeds (e.g., 4000, 4400), a third value (e.g., 4) for a third group of speeds (e.g., 4800, 5200), a fourth value (e.g., 2) for a fourth group of speeds (5600, 6000), and a fifth value (e.g., 0) for a fifth group of speeds (e.g., 6400, 6800, 7200).

Using the foregoing techniques a minimum (e.g., 1 tCK) DQS IB reset may be achieved. However, in some embodiments with a divided clock topology (e.g., odd and even pipelines), for the minimum reset pulse the write command ends (e.g., counter elapses) in one pipeline and starts (e.g., new write command enters) in the next cycle in the other pipeline. Furthermore, as previously noted, the start is not merely for the cycle where the write command enters the first partition 104, as it is maintained until the write command progresses through the state machine 52. Using this property, a reset (e.g., a reset signal 184) from one pipeline may be used to suppress a set that would occur with the write command entering the other pipeline. This naturally delays the set of other pipelines by 2 tCK due to the divided clock topology. In other words, the minimum DQS IB reset is stretched from 1 tCK to 3 tCKs. This additional 2 tCKs of delay may reduce the wake-up time margin of the DQS IB. If the wake-up time margin is sufficiently large (e.g., 26 tCKs), the stretching of the minimum DQS IB is reset. However, if the margin is shorter than making such stretching suitable, the 1 tCK wide minimum reset may be adopted.

Figure 6:
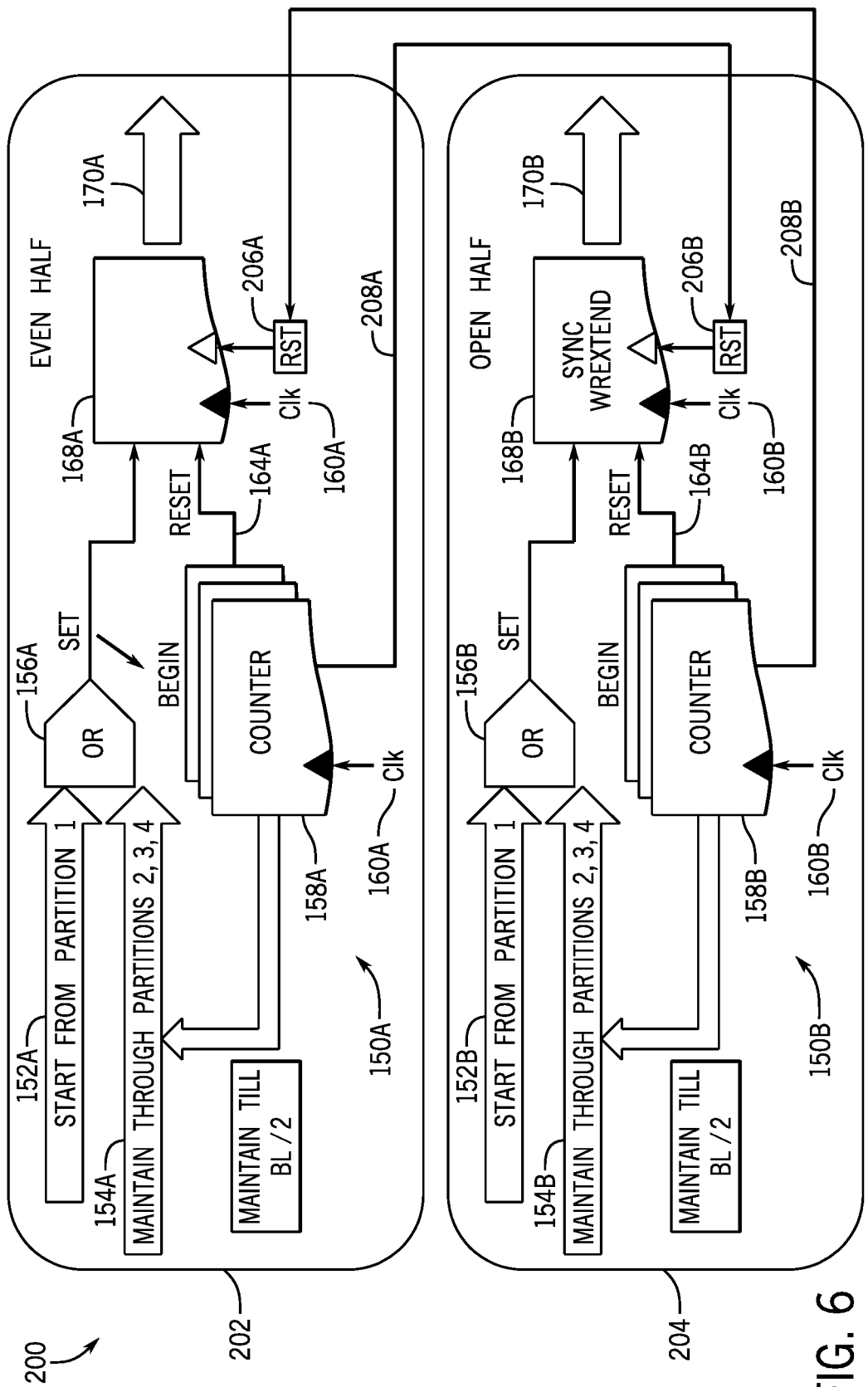
FIG. 6 is a block diagram of circuitry having two instantiations of the circuitry of FIG. 4 or 5, according to an embodiment of the present disclosure.

FIG. 6 is a block diagram of circuitry 200. The circuitry 200 is similar to the circuitry 150 of FIG. 4 except that the circuitry 200 includes two instantiations of the circuitry 150 (individually referred to as circuitries 150A and 150B). As previously noted, the circuitry 150 may be instantiated in more than one pipeline. The circuitry 150A is in an even pipeline 202, and the circuitry 150B is in an odd pipeline 204. The circuitry 150A uses a first clock 160A, and the circuitry 150B uses a second clock 160B. The clocks 160A and 160B alternate at a half-frequency of a common clock instead using alternating pulses of the common clock such that even pulses are propagated to the first clock 160A and odd pulses are propagated to the second clock 160B. Similarly, the even pipeline 202 includes a start signal 152A like the start signal 152, a maintain signal 154A like the maintain signal 154, an OR gate 156A like the OR circuitry 156, one or more counters 158A like the one or more counters 158, and a flip-flop 168A like the flip-flop 168. The even pipeline 202 uses the reset signal 164A like the circuitry 150 uses the reset signal 164.

The odd pipeline 204 includes a start signal 152B like the start signal 152, a maintain signal 154B like the maintain signal 154, an OR gate 156B like the OR circuitry 156, one or more counters 158B like the one or more counters 158, and a flip-flop 168B like the flip-flop 168. The odd pipeline 204 uses the reset signal 164B like the circuitry 150 uses the reset signal 164.

However, the even and odd pipelines 202 and 204 may be used to suppress a set of the other pipeline. For instance, when a start signal 152A has been received and is still maintained using the maintain signals 154A, the even pipeline 202 may utilize a reset pin 206B on the flip-flop 168B to suppress setting/assertion of the DQS IB due to a suppression signal 208A preventing setting of the flip-flop 168B in the odd pipeline 204 until 3 cycles after a corresponding write command has exited the state machine 52. Similarly, when a start signal 152B has been received and is still maintained using the maintain signals 154B, the odd pipeline 204 may utilize a reset pin 206A on the flip-flop 168A to suppress setting/assertion of the DQS IB due to a suppression signal 208B preventing setting of the flip-flop 168A in the even pipeline 202 until 3 cycles after corresponding write command has exited the state machine 52.

Figure 7:
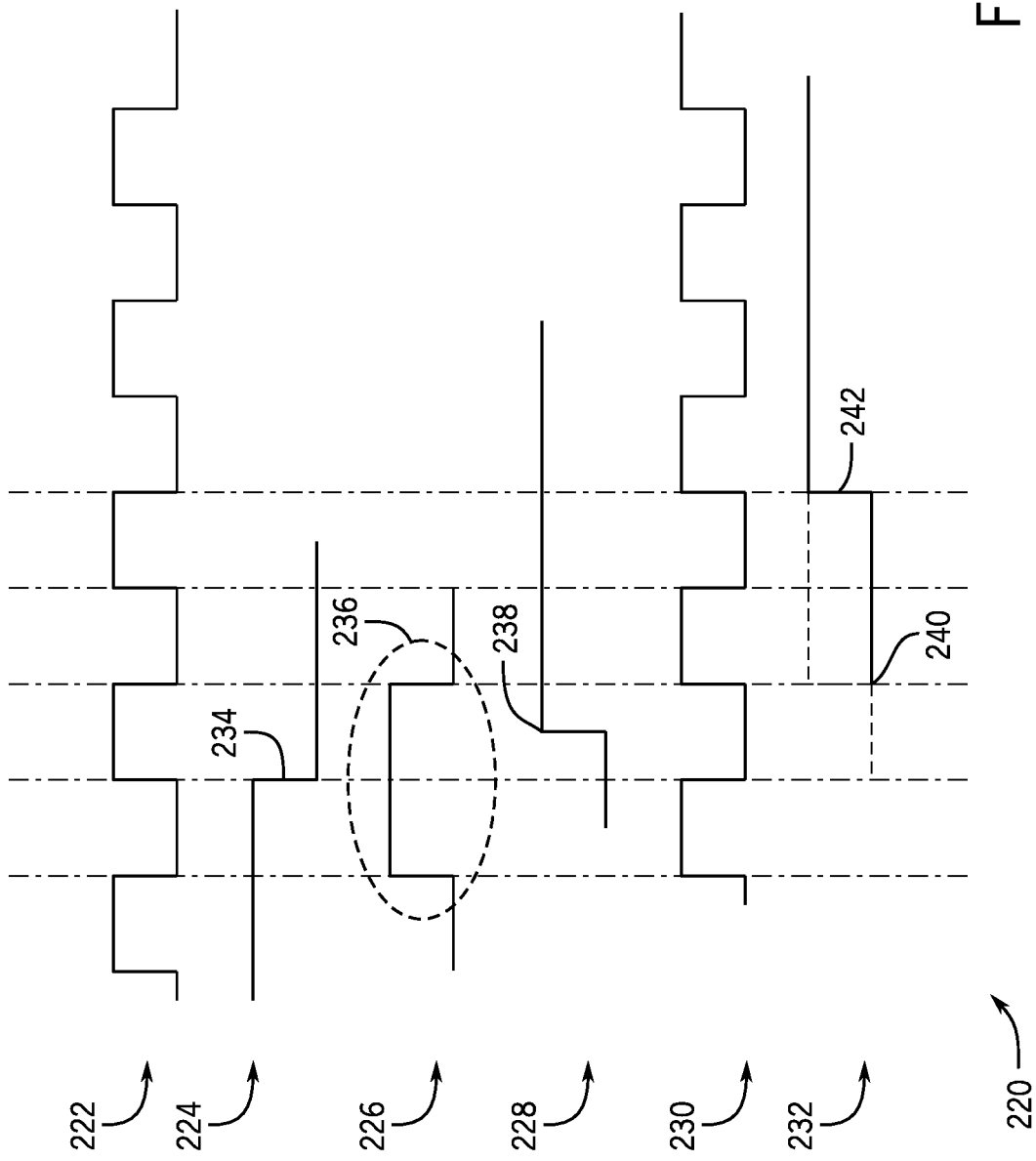
FIG. 7 is a graph of a timing diagram of operation using the circuitry of FIG. 6, according to an embodiment of the present disclosure.

FIG. 7 is a graph of an embodiment of a timing diagram 220 using the circuitry 200. The timing diagram 220 includes a line 222 that corresponds to the clock 160A and a line 224 that corresponds to the maintain signal 154A, the output of the OR gate 156A, an indicator from the one or more counters 158A, or any suitable indication that a write command is in and/or leaving the state machine 52 from the even pipeline and is to be reset. The timing diagram 220 also includes a line 226 that corresponds to the suppression signal 208A. The timing diagram 220 includes a line 230 that corresponds to the clock 160B and a line 232 that corresponds to the start signal 154A or another indication that a write command has been received at the first partition 102 of the odd pipeline 204. As illustrated by a falling edge 234, the write command is exiting/is to exit the state machine 52 (e.g., partition 108). Due to the write command passing through the state machine, a pulse 236 is generated on the suppression signal 208A. When a new write command enters the first partition 102, as indicated by the rising edge 238, output of the odd pipeline 204 would be asserted as indicated by the dotted rising edge 240 absent the pulse 236. However, due to pulse 236, the dotted rising edge 240 is suppressed until the pulse 236 ends and a next cycle of the clock 160B (e.g., 2 more cycles of tCK for the system clock) for a total of 3 tCKs DQS IB reset width from the falling edge 234 to the rising edge 242.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A memory device, comprising:
    a command interface configured to receive write commands from a host device;
    an input buffer configured to buffer data from the host device; and
    a state machine configured to:
        receive a command into a first partition of the state machine;
        enable a data strobe (DQS) input buffer in response to the command being received into the first partition;
        maintain the enablement of the DQS input buffer while the command traverses the state machine; and
        after a set duration of time, disabling the DQS input buffer.

2. The memory device of claim 1, wherein the state machine comprises one or more counters, and the set duration of time is a constant number of clock cycles set using the one or more counters.

3. The memory device of claim 2, wherein the constant number of clock cycles comprises a burst length plus a constant value.

4. The memory device of claim 1, wherein the set duration of time is a constant duration of time with a number of clock cycles counted being based on a speed grade set for the memory device.

5. The memory device of claim 4, wherein the speed grade is set using a mode register, a fuse, or an antifuse of the memory device.

6. The memory device of claim 1, wherein the state machine clocks the enablement and disablement of the DQS input buffer using a CWL shifter clock.

7. The memory device of claim 1, wherein the state machine comprises a plurality of partitions comprising the first partition, wherein enabling the DQS input buffer is performed using an enable signal that is based at least in part on pulses in the first partition.

8. The memory device of claim 7, wherein maintaining the enablement of the DQS input buffer is based on the enable signal that is also based at least in part on pulses in remaining partitions of the plurality of partitions.

9. The memory device of claim 8, wherein the state machine generates the enable signal by performing an OR operation on the pulses in the first partition and the pulses in the remaining partitions of the plurality of partitions.

10. The memory device of claim 7, wherein the first partition is configured to receive the command as an external write command from the host device.

11. The memory device of claim 10, wherein the plurality of partitions comprises a second partition corresponding to a pop of a read address corresponding to the external write command in a first FIFO, a third partition corresponding to a read operation using the read address, and a fourth partition corresponding to a pop of a write address corresponding to the read address in a second FIFO and performing the write using the write address.

12. A method for operating a memory device, comprising:
    receiving, at a command interface of the memory device, a write command;
    transmitting the write command from the command interface to a first partition of a plurality of partitions of a state machine of the memory device;
    in response to the command interface being received at the first partition, asserting a start signal;
    enabling an input buffer of the memory device using the start signal;
    propagating the write command through the state machine;
    in response to the write command being in remaining partitions of the plurality of partitions, asserting a maintain signal; and
    maintaining enablement of the input buffer due to the maintain signal after the start signal.

13. The method of claim 12, comprising driving the state machine of the memory device using a column address strobe (CAS) write latency (CWL) clock used to shift commands through a CWL shifter of the memory device.

14. The method of claim 12, wherein the state machine comprises a read-modify-write (RMW) state machine.

15. The method of claim 12, comprising disabling the input buffer after a set number of cycles after transmitting the write command to the first partition.

16. The method of claim 12, comprising disabling the input buffer after a set duration of time after transmitting the write command to the first partition regardless of speed grade of the memory device.

17. The method of claim 12, wherein the input buffer comprises a data strobe (DQS) input buffer.

18. The method of claim 12, wherein generating the maintain signal comprises performing an OR of all commands in the remaining partitions.

19. The method of claim 12, wherein enabling the input buffer comprises performing an OR operation of the start signal and the maintain signal to generate an enable signal configured to control when to enable and disable the input buffer.

20. The method of claim 19, comprising disabling the input buffer in response to a reset signal indicating that a number of cycles or an amount of time has elapsed since the write command was transmitted to the first partition.

21. A memory device, comprising:
   a column address strobe (CAS) write latency (CWL) shifter;
   a command interface configured to receive write commands from a host device;
   a data strobe (DQS) input buffer configured to buffer a DQS signal from the host device; and
   a state machine comprising:
      a first partition of a plurality of partitions configured to receive a command into the first partition of the state machine;
      remaining partitions of the plurality of partitions configured to receive the command in series from the first partition;
      OR circuitry configured to perform an OR operation on all commands in the plurality of partitions to generate an enable signal to enable a data strobe (DQS) input buffer; and
      reset circuitry configured to count a number of cycles of a clock of the CWL shifter and to generate a reset signal based at least in part on the counted number of cycles, wherein the reset signal is configured to disable the DQS input buffer after the command has traversed the state machine while the enable signal is configured to maintain enablement of the DQS input buffer while the command is traversing the state machine.

22. The memory device of claim 21, wherein the reset circuitry is configured to count the number of cycles+n cycles, wherein the number of cycles is static and n is variable and based on a speed grade of the memory device.

23. The memory device of claim 21, wherein the memory device comprises multiple pipelines, and a first pipeline of the multiple pipelines comprises the state machine.

24. The memory device of claim 23, wherein a second pipeline of the multiple pipelines comprises an additional state machine, comprising:
   a first additional partition of an additional plurality of partitions configured to receive a subsequent command into the first additional partition of the state machine;
   remaining additional partitions of the additional plurality of partitions configured to receive the subsequent command in series from the first additional partition;
   additional OR circuitry configured to perform an OR operation on all commands in the additional plurality of partitions to generate an additional enable signal to enable the DQS input buffer; and
   additional reset circuitry configured to count the number of cycles and to generate an additional reset signal based at least in part on the counted number of cycles, wherein the additional reset signal is configured to disable the DQS input buffer after the subsequent command has traversed the additional state machine while the additional enable signal is configured to maintain enablement of the DQS input buffer while the subsequent command is traversing the additional state machine.

25. The memory device of claim 24, wherein an assertion of the reset signal is configured to delay a set of the additional enable signal when the additional enable signal would be set one cycle of the clock without the delay.

26. The memory device of claim 25, wherein the delay of the additional enable signal causes the delayed set to occur after three cycles of the clock rather than after one cycle that would occur without the delay.

* * * * *